US005465265A

United States Patent [19]
Ota

[11] Patent Number: 5,465,265
[45] Date of Patent: Nov. 7, 1995

[54] MULTI-BEAM LASER LIGHT SOURCE AND MULTI-BEAM SEMICONDUCTOR LASER ARRAY

[75] Inventor: Takeshi Ota, Kanagawa, Japan

[73] Assignee: Fuji Xerox Co., Ltd., Tokyo, Japan

[21] Appl. No.: 79,917

[22] Filed: Jun. 23, 1993

[30] Foreign Application Priority Data

| Jun. 24, 1992 | [JP] | Japan | 4-166313 |
|---|---|---|---|
| Jan. 12, 1993 | [JP] | Japan | 5-003515 |

[51] Int. Cl.$^6$ .............................. H01S 3/085; H01L 33/00
[52] U.S. Cl. ................... 372/101; 372/50; 372/107; 359/619; 359/621; 359/710; 359/741; 257/88; 257/98
[58] Field of Search ................ 372/97, 101, 107, 372/108, 109, 50, 95; 362/244, 259; 359/619, 620, 621, 708, 710, 719, 741; 257/88, 98

[56] References Cited

U.S. PATENT DOCUMENTS

| 4,185,891 | 1/1980 | Kaestner | 372/101 X |
|---|---|---|---|
| 4,972,427 | 11/1990 | Streifer et al. | 372/50 X |
| 4,995,050 | 2/1991 | Waarts et al. | 372/108 X |
| 5,027,359 | 6/1991 | Leger et al. | 372/101 X |
| 5,033,060 | 7/1991 | Leger et al. | 372/97 |
| 5,052,783 | 10/1991 | Hamada | 359/40 |
| 5,139,609 | 8/1992 | Fields et al. | 372/50 X |
| 5,181,224 | 1/1993 | Snyder | 372/101 |
| 5,212,707 | 5/1993 | Heidel et al. | 372/50 |
| 5,216,687 | 6/1993 | Fujino et al. | 372/70 |
| 5,260,587 | 11/1993 | Sato | 372/50 X |

FOREIGN PATENT DOCUMENTS

| 59-15219 | 1/1984 | Japan . | |
|---|---|---|---|
| 1-45065 | 10/1989 | Japan . | |
| 2-39583 | 2/1990 | Japan . | |
| 3-239374 | 10/1991 | Japan | 257/88 |
| 5-29711 | 2/1993 | Japan . | |
| 5-66354 | 3/1993 | Japan . | |

OTHER PUBLICATIONS

Minoura, K. et al., Proceedings SPIE, vol. 1079, pp. 462–474, 1989 no month "A Study on Laser Scanning Systems Using a Monolithic Arrayed Laser Diode".

Thornton et al., "Properties of Closely Spaced Independently Addressable Laser . . . ", Applied Physics Letter 56 (17), pp. 1623–1625, Apr. 1990.

Oikawa, M. et al., "Array of Distributed–Index Planar Micro–Lenses . . . ", Japanese Journal of Applied Physics, 20 (4), pp. 296–298, Apr. 1981.

Okuda, E. et al., "Planar Gradient–Index Glass Waveguide and its . . . ", Optical Society of America 23, pp. 1745–1748, Jun. 1984.

Abstract of the Japan Society Applied Physics by Ota et al., the 52nd Autumn Meeting, no month, 1991, "Spacing of Laser Diode Array for Multi–Beam Laser Printer".

"Highspeed Magneto–Optical Disk Drive with Employment of 4–Beam Optical Head," Nakagome, Kogaku vol. 20, No. 11, 1991, pp. 741–742.

(List continued on next page.)

Primary Examiner—Rodney B. Bovernick
Assistant Examiner—Hemang Sanghavi
Attorney, Agent, or Firm—Finnegan, Henderson, Farabow, Garrett & Dunner

[57] ABSTRACT

In a multi-beam laser light source constructed of a laser array in which a plurality of independently drivable laser elements are arranged in an equiinterval, and a lens array in which a plurality of lenses employed in accordance with the plural laser elements are arranged in an equiinterval, a laser array interval of the laser array is different from a lens array interval of the lens array.

Further, the multi-beam semiconductor laser array is so constructed that a gradient-index type planar micro lens array is closely fitted to a laser beam projection edge of a semiconductor laser array in which a plurality of independently drivable semiconductor laser elements have been arranged on the same substrate.

24 Claims, 9 Drawing Sheets

OTHER PUBLICATIONS

Abstract of Japanese Laid Open Patent Application No. Hei. 5-66354. Ota, Mar. 19, 1993.

Abstract of Japanese Laid Open Patent Application No. Sho. 59-15219. Matsunaga, Jan. 26, 1984.

Abstract of Japanese Laid Open Patent Application No. Sho. Hei. 5-29711. Ota, Feb. 5, 1993.

$\alpha = b/a$
$\beta = d/c$ $\alpha = b/a$
$\beta = d/c$ $r_2 > r_1$ $r_1 > r_2$ $$\theta_2 = \frac{a}{b}\theta_1$$
$$\beta = f_2/f_1$$

MULTI-BEAM LASER LIGHT SOURCE AND MULTI-BEAM SEMICONDUCTOR LASER ARRAY

BACKGROUND OF THE INVENTION

The present invention relates to a multi-beam laser light source used in either a multi-beam type laser beam printer, or a multi-beam type optical disk.

The present invention relates to a multi-beam semiconductor laser array employed as a light source in multi-beam type laser beam printers and optical disk apparatuses.

Conventionally, it is known in the field to use a multi-beam laser light source to simultaneously scan plural lines to equivalently increase the scanning speed. In another conventional technique, the semiconductor laser array is used as a multi-beam laser light source and this semiconductor laser array is combined with interlaced scanning in order to reduce the pitch of the scanning lines. This technique has been reported in, for instance, K. Minoura, M. Suzuki, and S. Miyazawa, SPIE, Vol. 1079, page 462 in 1989, and Japanese patent publication No. 1-45065 in 1989. The Inventors or Applicants have reported that, in a multi-beam laser printer employing a semiconductor laser array as a light source, there is an inverse proportional relationship between the array interval "x" of the semiconductor laser array and the divergence angle θ of the laser beam projected from the respective semiconductor laser elements along the array arranging direction (see Extended Abstracts (The 52nd Autumn Meeting, 1991); The Japan Society Applied Physics by Ota, Ito, and Tatsuoka, 11p-ZM-19, and Japanese Patent application No. 3-0158608 filed by the Applicants).

Concretely speaking, the following relationship can be satisfied between the array interval "x" of the semiconductor laser array and the divergence angle θ along the array arranging direction:

$$x = 2A\lambda i / \{k\pi \sin(\theta/2)\} \quad (1)$$

where "A" denotes a spot divergence (apodization) coefficient determined by an aperture of a major image forming optical system, "λ" denotes a wavelength of the laser beam, "i" denotes an interlaced period (scanning order), and "k" denotes a spot diameter correction coefficient. The typical values of the above-described parameters are, for instance, A=1.98, λ=0.78 micrometers, i=1 (corresponding to such a non-interlaced scanning operation), and k=1.5.

As apparent from the foregoing description, if the divergence angle "θ" of the laser beam is small, then the array interval "x" of the semiconductor laser array may be made wide.

Generally speaking, the divergence angle of the laser beam of the semiconductor laser is equal to approximately 8° to 15° (defined by 1/e² of center intensity) along the parallel direction with respect to the junction plane, and it is rather difficult to greatly change this divergence angle. Assuming now that the divergence angle "θ" of the laser beam along the array arranging direction is 12°. When these typical values of the respective parameters are substituted into the equation (1), the array interval "x" is calculated as 6 micrometers. An array interval of a semiconductor laser array may be manufactured on the order of 10 micrometers in accordance with the current manufacturing level. However, since array intervals narrower than approximately 10 micrometers hardly can be manufactured, interlaced scanning techniques are necessarily required.

On the other hand, such a method has been filed by the Applicant in Japanese patent application No. 3-227532 in 1991 in which the micro lens is combined with the semiconductor laser to reduce the virtual divergence angle of the laser beam, and therefore the intervals of the imaging spots on the image forming plane (photoreceptor surface plane) can be effectively and closely spaced with each other even when the semiconductor laser array having a wide array intervals is employed.

As represented in FIG. 7, in this conventional structure a micro lens array 2 is provided, corresponding to the respective semiconductor laser elements 1a and 1b of the semiconductor laser array 1. The laser beams emitted from the semiconductor laser elements 1a and 1b have passed through the respective micro lenses of the micro lens array 2, and further have passed through the objective lens 25, and thereafter are focused onto the focal plane (photoreceptor surface plane) P3.

In the optical system shown in FIG. 7, the positions of the projection points of the laser beams are moved to the second plane P2 located behind the first plane P1 where the position of the light source is actually located, as viewed from the objective lens 25, and also the divergence angle $\theta_1$ of the laser beams along the array arranging direction is reduced to $\theta_2$.

It should be noted in FIG. 7 that "a" indicates a distance between the major plane of the micro lens array 2 at an image side and the first plane P1; "b" indicates a distance between the major plane of the micro lens array 2 at the image side and the second plane P2; "$r_1$" indicates an array interval of the semiconductor laser array 1; "$r_2$" indicates an array interval of the micro lens array 2; "$f_1$" indicates a distance between the second plane P2 and the objective lens 25; and "$f_2$" indicates a distance between the objective lens 25 and the focal plane (photoreceptor surface plane) P3.

On the other hand, a conventional method has been proposed in which a plurality of toroidal lenses are provided which are used in the Pyramidal Error Correction Optics of the laser beam scanning apparatus with using the polygon, so that the imaging spots on the focal point plane (sensitive body plane) are closely spaced (see Japanese Laid-open Patent Application No. 59-15219, laid open in 1984). This is schematically illustrated in FIG. 8, which shows that by expanding the light path, the laser beams projected from the respective semiconductor laser elements of the semiconductor laser array 1 are converted into parallel beam light by the collimator lens 21, the optical axes of the respective laser beams are directed toward the inside by the cylindrical lens 22, and the respective laser beams are reflected at the mirror surface of the polygon scanner 23. Furthermore, the reflected laser beams pass through the toroidal lenses 24a to 24c provided in relation to those laser beams, and then are focused onto the focal point plane (photoreceptor surface plane) P3 by the objective (f-θ) lens 25.

In the prior art shown in FIG. 7, the divergence angle θ of the laser beams is reduced, whereas in the prior art shown in FIG. 8, the optical paths of the laser beams are varied every laser beam by providing a plurality of toroidal lenses 24a to 24c between the polygon scanner 23 and the objective (f-θ) lens 25.

However, the above-described conventional methods have the following problems.

With respect to the interlaced scanning operation, since the respective laser beams must be independently modulated by the image (picture) signals having predetermined time relationships, complex controls are required for the image signals. Since the intervals of the adjoining imaging spots on the image forming plane (photoreceptor surface plane) are wide when this interlaced scanning operation is carried out, high mechanical precision is required for the scanning optical system (see the above-described Japanese patent application No. 3-158608), and the scanning lines are easily distorted in accordance with the f-θ correction (see the above-explained publication of SPIE Vol. 1079, page 462, by K. Minoura, M. Suzuki, and S. Miyazawa in 1989).

Also, in one conventional method for combining the micro lens array and the semiconductor laser as shown in FIG. 7, a change is required in designing the major image forming optical system in accordance with the reduction of the divergence angle of the laser beam, as compared with that used in the single laser beam printer. Accordingly, there is a problem that, for instance, the beam expander must be additionally required in the major image forming optical system (see the above-explained Japanese patent application No. 3-227532).

Further, in the other conventional method for providing a plurality of toroidal lenses to change the optical paths of the laser beams, the required plurality of toroidal lenses having complex structures causes high cost and, moreover, the alignment adjustments must be performed for each of these toroidal lenses.

Further, conventionally, multi-beam type laser beam printers and optical disk apparatuses have been known in the art. For instance, one multi-beam type laser beam printer is described in "A study or laser scanning systems using a monolithic arranged laser diode, written by K. Minoura, M. Suzuki and S. Miyazawa, Proceedings SPIE, Vol. 1079, pages 462–474 in 1989. Also, one multi-beam type optical disk apparatus is disclosed in "Highspeed Magneto-Optical Disk Drive With Employment Of 4-Beam Optical Head," written by Nakagome, Kogaku Vol. 20, No. 11, pages 741 to 742 in 1991.

Very recently, such a multi-beam semiconductor array laser wherein laser elements are positioned adjacent to each other in an interval of 10 micrometers has been developed as the light source for these multi-beam type laser beam printer and optical disk apparatus (see Japanese Laid-open Patent Application No. 2-39583 opened in 1991, and "Properties of closely spaced independently addressable lasers fabricated by impurity-induced disordering" by R. L. Thornton et al., Applied Physics Letter 56 (17), pages 1623–1625 in 1990).

Another method for essentially closely spacing spot intervals on a focused plane by combining the multi-beam semiconductor laser array with the micro lens array with employment of such a multi-beam semiconductor array having wide array intervals, has been described in Japanese Laid-open Patent Application No. 3-227532, laid open in 1991 and filed by the Applicant.

In FIG. 15, there is shown the first method described in the above-mentioned Japanese Laid-open Patent Application No. 3-227532. Laser beam light projected from a plurality of laser beam optical sources LS at an divergence angle $\theta_1$ (defined by $1/e^2$ of center intensity), is processed by lenses $L_2$ provided dependent to the respective laser beam optical sources LS such that the divergence angle $\theta_1$ is reduced to another divergence angle $\theta_2$ (defined by $1/e^2$ of center intensity). As a result, the positions of the laser beam light sources LS are equivalently present at the virtual optical source plane P1 of FIG. 15, as optically viewed from the imaging lens L1. There is a conjugate relationship between the virtual optical source plane P1 and the image forming plane P2 by way of the imaging lens L1. It is assumed that a diameter of an imaging spot of the laser beam light on the image forming plane P2 is "d2" when lateral magnification β is equal to $f_2/f_1$. It should be noted that symbol $f_1$ denotes a distance between the light source plane P1 and the imaging lens L1, and symbol $f_2$ indicates a distance between the imaging lens L1 and the image forming plane P2. Also, it is assumed that another diameter of an imaging spot of the laser beam light on the image forming plane P2 is d1 when the image is formed at the lateral magnification $\beta=f_2/f_1$ by employing the image forming lens L1, but no image forming lens L2. Comparing the above-explained two optical systems with each other, one diameter d2 of the imaging spot is larger than the other diameter d1 of the imaging spot, though the intervals "r" of the imaging spots are equal to each other.

In accordance with the method as shown in FIG. 15, the divergence angle $\theta_1$ of the laser beams is reduced to $\theta_2$ by the projection points of the laser beams (precisely speaking, positions between beam waists) are positioned inside the focal distance $f_1$ of the imaging lens L1, and the virtual projection points of the laser beams, namely the virtual optical source plane P1 are moved in the left direction, as viewed in FIG.15.

FIG. 16 represents the second method described in the specification of the above-mentioned Japanese Laid-open Patent Application No. 3-227532. The laser beam light projected from the arrayed semiconductor laser element 1 is converted into geometrically and optically parallel light by way of the arrayed micro lens 6. However, the converted parallel light wave-optically has a certain divergence angle $\theta_2$. This divergence angle $\theta_2$ is smaller than the divergence angle $\theta_2$ of the laser beam light projected from the semiconductor laser element 1. In this case, the optical system is designed in such a manner that the virtual projection points of the laser beams are present at the major plane of the micro lens 6.

As described in the above-explained specification, the spot diameter is increased, while the spot intervals on the image forming plane remain identical in accordance with the decrease in the divergence angle of the laser beam light. As a consequence, if the divergence angle of the laser beam light is made small, even when the array intervals are wide, the spot intervals on the image forming plane can be substantially closely positioned with each other by adjusting the magnification of the optical system.

However, the above-described conventional methods, as shown in FIGS. 15 and 16, have problems because since the multi-beam semiconductor laser array and the micro lens array are provided as an independent optical component, optically difficult alignment adjustments are required for these optical components.

SUMMARY OF THE INVENTION

An object of the present invention is to provide a multi-beam laser light source capable of closely spacing intervals of imaging spots at a focal point plane in a simple optical system, even when a laser array having a wide array interval is employed, without introducing an interlaced scanning operation.

To solve the above-described problems, a multi-beam laser light source, according to the present invention is provided.

Since the laser array interval is different from the lens array interval, the virtual projection point positions of the laser beams are moved along the optical axis direction, as viewed from the major image forming optical system, and the virtual interval of the laser beam projection points is made narrow. Thus, the image forming spots on the focal point plane (sensitive body plane) can be closely spaced without narrowing the laser array interval.

Furthermore, since the image forming optical system is provided between the laser array and the micro lens array, the projection point positions of the laser beams are converted into the intermediate plane positions between the laser array and the micro lens array. As the virtual divergence angle of the laser beams at the intermediate plane positions is smaller than the original divergence angle, the image forming spots on the focal point plane (sensitive body plane) can be closely spaced, while maintaining the wide laser array interval.

The present invention has been made in an attempt to solve the above-described problems, and therefore, has an object to provide a multi-beam semiconductor laser array used with a micro lens array in a combination, capable of readily adjusting an optical alignment between the micro lens array and the multi-beam semiconductor laser array.

To achieve the above object, a multi-beam semiconductor laser array according to the present invent is provided.

Also, the micro lens array may be closely positioned via a transparent spacer to the projection edge of the laser beams of the semiconductor laser array.

In accordance with the present invention, since the gradient index type planar micro lens array is employed so as to converge the laser beams projected from the multi-beam semiconductor laser array, the optical alignment adjustment can be performed under such a condition that the projection edge of the laser beams from the semiconductor laser array is fitted with the planar micro lens array, resulting in easy optical alignments for both of these optical components.

DETAILED DESCRIPTION OF THE PREFERRED EMBODIMENTS

Referring now to drawings, features of the present invention will be described in more detail based upon preferred embodiments.

Figure 1:
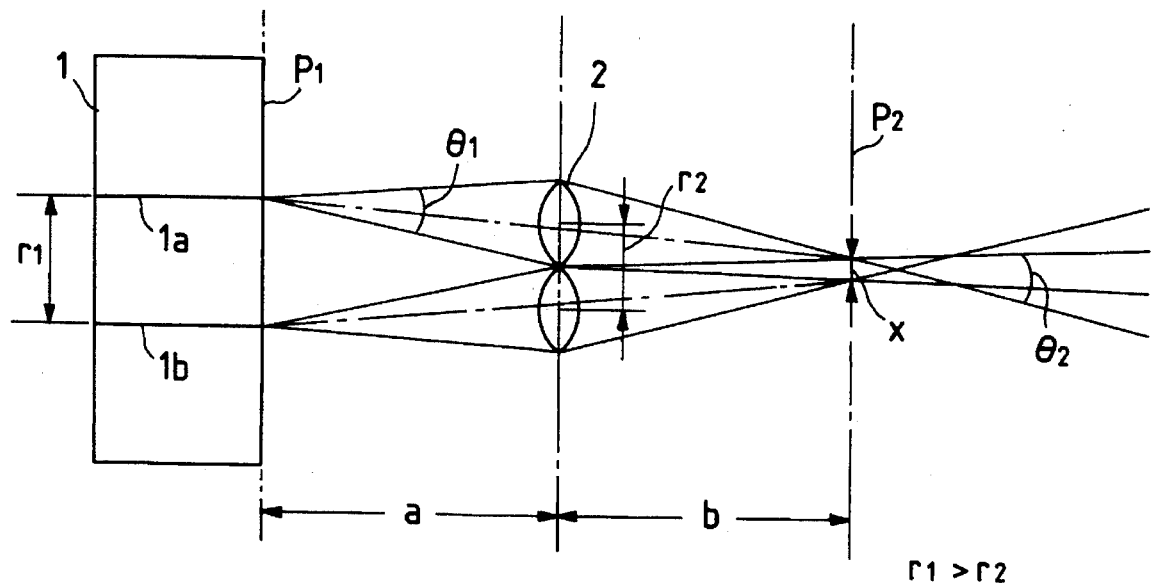
FIG. 1 is an expansion view for showing a first preferred embodiment of the present invention, involving an optical axis of an optical system.

In FIG. 1, there is shown a first preferred embodiment of the present invention. In accordance with the first preferred embodiment, a micro lens array 2 having micro lenses provided in relation with the respective semiconductor laser elements 1a and 1b of the semiconductor laser array 1, is employed, and an interval between the semiconductor laser elements 1a and 1b of the semiconductor laser array 1, namely an array interval "$r_1$" is made longer than an array interval "$r_2$" of the micro lens array 2. As apparent from FIG. 1, virtual projection point positions of the laser beams are moved from a first plane P1 to a second plane P2, as viewed from a major image forming optical system.

Further, assuming now that an interval between the projection points of the laser beams in the second plan P2 is "x", and an divergence angle of the laser beams is "$\theta_2$", a relationship between the intervals "$r_1$" and "x", and also between the divergence angles "$\theta_1$" and "$\theta_2$" is expressed by the following equations (2) and (3). It should be noted that α is b/a and indicates a (divergence angle) conversion coefficient. This conversion coefficient "α" corresponds to a projection magnification of the micro lens array 2 from the first plane P1 to the second plane P2. It should also be noted that symbol "a" denotes a distance between the first plane P1 and the micro lens array 2, and symbol "b" indicates a distance between the micro lens array 2 and the second plane P2.

$$x = r_2 - (r_1 - r_2) \times (b/a) = r_2 - (r_1 - r_2) \times \alpha \quad (2)$$

$$\theta_2 = \theta_1 / (b/a) = \theta_1 / \alpha \quad (3)$$

First, a description will now be made of a design example in which the divergence angle of the laser beams is not changed. It is assumed that the array interval "$r_1$" of the semiconductor laser array 1 is equal to 100 micrometers, and the divergence angle $\theta_1$ of the laser beams is equal to 12°. As the design procedure, it is preferable to first determined either the projection point interval "x" of the laser beams, or the divergence angle "$\theta_2$".

This is because both of the interval "x" and the divergence angle "$\theta_2$" must satisfy the previously explained equation (1) in the prior art. Considering such a structure when no change is made of the divergence angle of the laser beams, assuming now that $\theta_2 = \theta_1 = 12°$, the projection point interval "x" is equal to 6 micrometers based upon the equation (1), whereas the divergence angle conversion coefficient "θ" is equal to 1.0 based on the equation (3). As the array interval "$r_1$" of the semiconductor laser array 1 is equal to 100 micrometers, the array interval "$r_2$" of the micro lens array 2 becomes 53 micrometers, which is calculated from the equation (2). In accordance with this design example, since only the effective projection point interval of the laser beams can be closely spaced with each other without varying the divergence angle of the laser beams, a beam expander is no longer required.

In another design example, that a method for reducing an divergence angle of laser beams is utilized. In this case, it also is assumed that the array interval "$r_1$" of the semiconductor laser is equal to 100 micrometers, and the divergence angle "$θ_1$" of the laser beams is equal to 12°. First, a determination is made of the divergence angle $θ_2$=2.4°, and this value is substituted into the equation (1) (assuming θ=$θ_2$=2.4). As a result, the interval "x" (=$r_1$) becomes 30 micrometers, and the conversion efficiency "θ" becomes 5.0, which is calculated from the equation (3). It should be understood that other parameters defined in the equation (1) have been calculated in accordance with the above-explained typical values (A=1.98, i=1, λ=0.78 micrometers, k=1.5). These parameters are substituted into the equation (2), thereby obtaining $r_2$=86 micrometers. In accordance with this design example, the projection point interval of the laser beams could be closely spaced from 100 micrometers to 30 micrometers, and also the divergence angle of the laser beams is reduced from $$θ_1=12° \text{ to } θ_2=2.4°.$$

Figure 2:
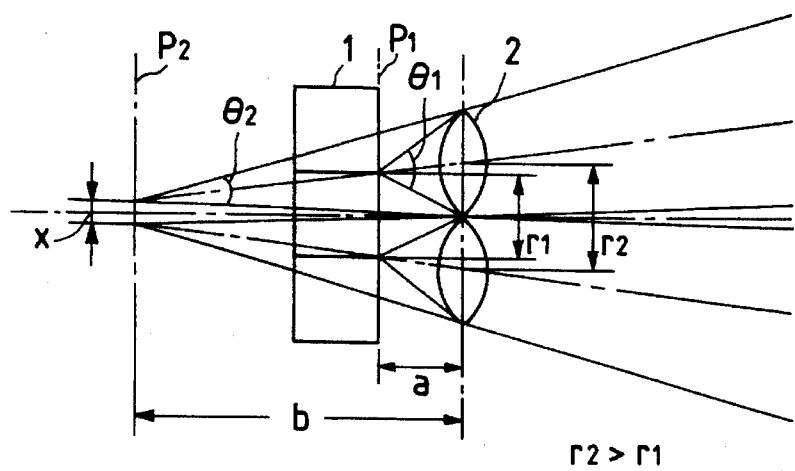
FIG. 2 is an expansion view for showing a second preferred embodiment of the present invention, involving an optical axis of an optical system.

In FIG. 2, shows a second preferred embodiment of the present invention. In this preferred embodiment, the array interval "$r_1$" of the semiconductor laser array 1 is set to be narrower than the array interval "$r_2$" of the micro lens array 2, which is the reverse of the interval setting of the first preferred embodiment. As a consequence, the plane P2 involving the virtual projection points of the laser beams is moved backward, the projection point interval "x" of the laser beams is reduced, and further the divergence angle "$θ_1$" of the laser beams is reduced to "$θ_2$". In this case, a relationship between the array interval "$r_1$" and the projection point intervals "x", and another relationship between the divergence angles "$θ_1$" and "$θ_2$" are given as follows. It should be understood that the above-described equation (3) is equivalent to the following equation (5).

$$x=r_1-(r_2-r_1)/(b/a)=r_1-(r_2-r_1)×α \quad (4)$$

$$θ_2=(b/a)×θ_1=θ_1/α \quad (5)$$

It should also be noted that the relationship of b>a, namely α>1 must be satisfied in the optical system shown in FIG. 2. In the optical system of FIG. 2, if the micro lens array 2 would be a concave lens, a value of 1 >α>0 may be obtained. However, in this case, the divergence angle of the laser beams would be increased. To the contrary, in case of 0>α, the optical system of FIG. 2 would become the optical system of FIG. 1.

Also, assuming now that $θ_2$=2.4°, x=30 micrometers, and $r_1$=100 micrometers in this second preferred embodiment, when a calculation similar to that of the first preferred embodiment is carried out, the conversion coefficient α=5.0, and the array interval "$r_2$" of the micro lens array $r_2$=114 micrometers.

Figure 3:
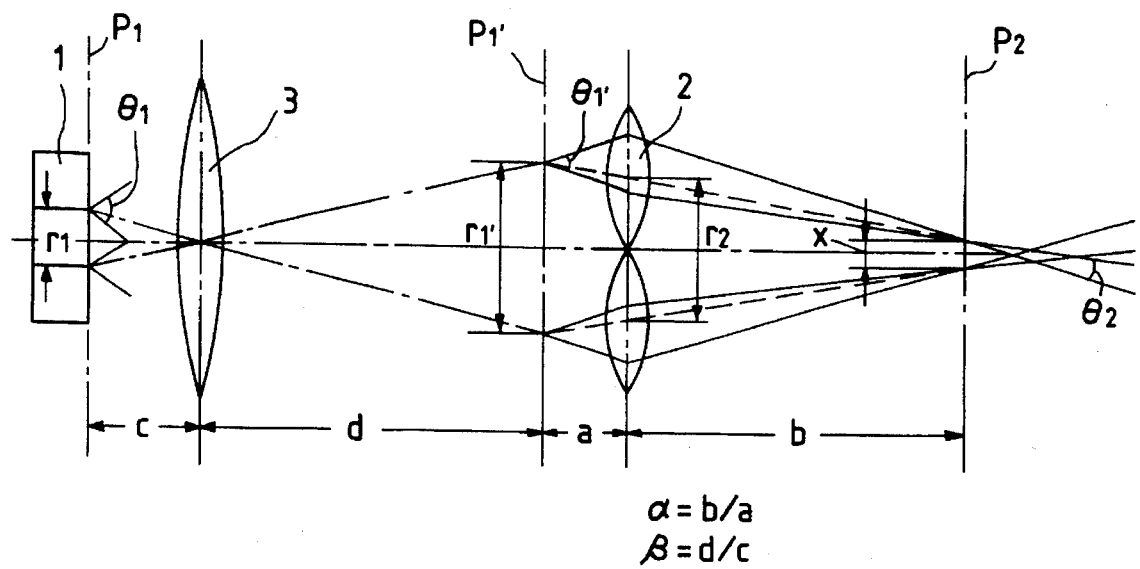
FIG. 3 is an expansion view for showing a third preferred embodiment of the present invention, involving an optical axis of an optical system.

FIG. 3 represents a third preferred embodiment of the present invention. This preferred embodiment corresponds to such an embodiment that a relay lens 3 is provided with the optical system of the first preferred embodiment. In accordance with the third preferred embodiment, the first plane P1 is converted (projected) into an intermediate plane P1' by the relay lens 3. Since the micro lens array 2 is arranged in a manner similar to that of the first preferred embodiment with regard to the intermediate plane P1', this intermediate plane P1' is converted into a second plane P2.

Both of a projection point interval $r_1$' of the laser beams, and a virtual divergence angle $θ_1$' of the laser beams at the intermediate plane P1' are expressed by the below-mentioned equations. It should be noted that symbol "β" indicates lateral magnification of the relay lens 3 and is equal to d/c, and this lateral magnification "β" will be referred to a projection coefficient.

$$r_1'=β×r_1 \quad (6)$$

$$θ_1'=θ_1/β \quad (7)$$

Both of the projection point interval "x" of the laser beams and the virtual divergence angle $θ_2$ of the laser beams at the second plane P2 are obtained by substituting the above-explained equations (6) and (7) into the above-described equations (4) and (5):

$$x=r_2-(r_1'-r_2)×α=(β×r_1-r_2)×α \quad (8)$$

$$θ_2=θ_1'/α=θ_1/(αβ) \quad (9)$$

These equations (8) and (9) are modified to obtain the following equations:

$$α=(θ_1 r_1)/(θ_2 r_2)+(x/r_2)-1$$

$$β=(θ_2/θ_1)(1/α)$$

For the sake of easy understanding of these equations, assuming now that: $χ=x/r_2$, $Θ=θ_1/θ_2$, $γ=r_1/r_2$, the below-mentioned equations are obtained.

$$α=Θγ+χ-1 \quad (10)$$

$$β=Θ/α \quad (11)$$

In accordance with this third preferred embodiment, since the parameter such as the projection coefficient "β" is increased, the free degree of design choice is increased, and thus, the array interval "$r_2$" of the semiconductor laser array 1 and the array interval "$r_2$" of the microlens array 2 can be separately set. For example, assuming now that $θ_1$=12°, $θ_2$=2.4°, x=30 micrometers, and $r_1$=$r_2$=100 micrometers, the calculation results are given from the equation (10) and the equation (11), respectively, α=4.3 and β=1.16.

For a reference purpose, if the values of $r_1$' and $θ_1$', are calculated, then $r_1'=βr_1$=116 micrometers, and $θ_1'=θ_1/β$=10.30 based on the conditions of β=1.16 and $r_1$=100 micrometers.

In other words, it may be understood from the above-described design example that this design is equivalent to a combination of the laser array having the array interval of 116 micrometers and the divergence angle of 10.3° with the micro lens array having the array interval of 100 micrometers.

Since the array intervals of the semiconductor laser array and the micro lens array need not be changed in accordance with the individual laser beam printer and the like, both of the semiconductor laser array and the micro lens array can be commonly used in the third preferred embodiment, resulting in increasing the productivity of the multi-beam laser light source.

It should be understood that differences between this third preferred embodiment and the prior art mentioned in the above-explained Japanese Laid-open Patent Application No. 59-15219 are given as follows. As to a first different point, the optical paths of the laser beams are changed by utilizing the anamorphic optical system in this prior art system, whereas the optical system for changing the light paths thereof is provided at the side of the laser beam optical system in this preferred embodiment. As a result, the optical system of the third preferred embodiment can be made compact. As to a second different point, a plurality of independent toroidal lenses are employed and the alignment adjustments are carried out for the respective toroidal lenses in the prior art system, whereas the alignment adjustment is entirely performed by employing the micro lens array in accordance with the third preferred embodiment. In view of practical point, the second difference is important. This is because the cost of the micro lens array is lower than that of the plural toroidal lenses, and therefore the alignment adjustment can be entirely performed. Therefore, the stage number required for this alignment adjustment can be reduced, as compared with the conventional system.

Figure 4:
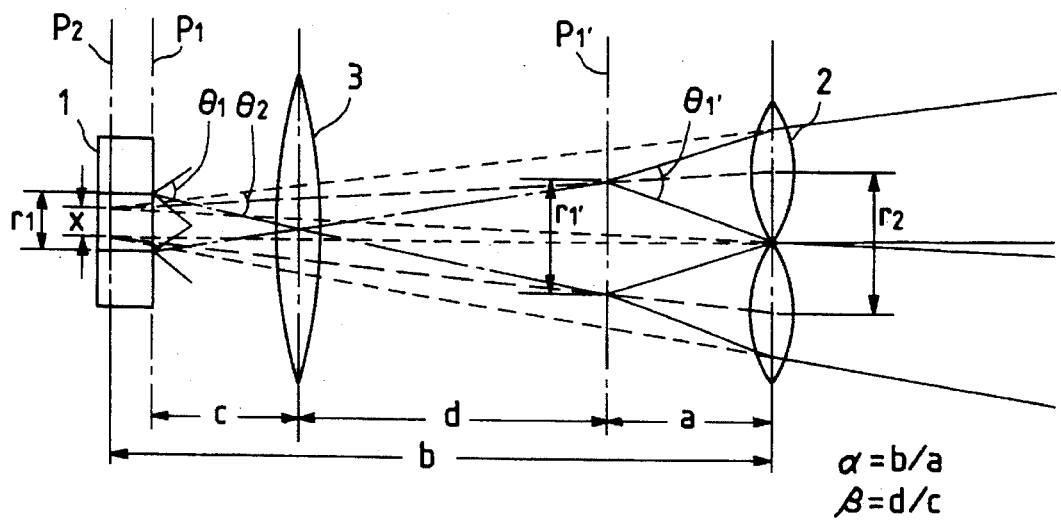
FIG. 4 is an expansion view for showing a fourth preferred embodiment of the present invention, involving an optical axis of an optical system.

In FIG. 4, there is shown a fourth preferred embodiment of the present invention. This fourth preferred embodiment corresponds to such an embodiment that a relay lens 3 is newly employed in the optical system of the second preferred embodiment. The first plane P1 is converted (projected) into the intermediate plane Pi' by the relay lens 3. Since the micro lens array 2 is arranged in a similar manner to that of the second preferred embodiment with respect to this intermediate plane P1', the intermediate plane P1' is converted into the second plane P2.

The projection point interval "x" of the laser beams and the virtual divergence angle $\theta_2$ of the laser beams at the second plane P2 are obtained by substituting the equations (6) and (7) into the equations (4) and (5), respective as follows:

$$x = r_1' - \alpha \times (r_2 - r_1') = \beta \times r_1 - \alpha \times (r_2 - \beta \times r_1) \quad (12)$$

$$\theta_2 = \theta_1'/\alpha = \theta_1/(\alpha\beta) \quad (13)$$

Based upon the above equations (12) and (13), a quadratic equation as to "$\alpha$" will be conducted as follows:

$$\alpha^2 + \{(x/r_2) - (\theta_1/\theta_2)\}\alpha - (\theta_1/\theta_2)(r_1/r_2) = 0$$

For the sake of easy understanding of this equation, assuming now that: $\chi = x/r_2$, $\Theta = \theta_1/\theta_2$, $\gamma = r_1/r_2$, then the following equation is given:

$$\alpha^2 + (\chi - \Theta\gamma)\alpha - \Theta\gamma = 0 \quad (14)$$

A solution of this quadratic equation is expressed by the below-mentioned equation:

$$\alpha = (\tfrac{1}{2})[-(\chi - \Theta\gamma) \pm \{(\chi - \Theta\gamma)^2 + 4\Theta\gamma\}^{1/2}] \quad (15)$$

If "$\alpha$" is obtained, then "$\beta$" is similarly obtained based upon the following equation:

$$\beta = \Theta/\alpha \quad (16)$$

For instance, assuming now that $\theta_1 = 12°$, $\theta_2 = 1.2°$, $x = 60$ micrometers, $r_1 = 25$ micrometers, and $r_2 = 100$ micrometers, $\chi = 0.6$, $\Theta = 10$, and $r = \tfrac{1}{4}$ are calculated. Although $\alpha = 2.80$, $-0.90$ is obtained based on the equation (15), since the optical system of this preferred embodiment corresponds to that of FIG. 2, it must be $\alpha > 1$, as described above. As a consequence, it becomes $\alpha = 2.80$. $\beta = 3.58$ corresponding to this "$\alpha$" is obtained from the equation (16).

For a reference purpose, when a calculation is performed as to the values of $r_1'$ and $\theta_1'$, the following results are obtained based upon $\beta = 3.58$ and $r_1 = 25$ micrometers: $r_1' = \beta r_1 = 89.5$ micrometers, and $\theta_1' = \theta_1/\beta = 3.35°$.

In other words, the above-described design example is equivalent to such an optical system that the laser array having the array interval of 89.5 micrometers and the divergence angle of 3.35 is combined with the micro lens array having the array interval of 100 micrometers.

Figure 7:
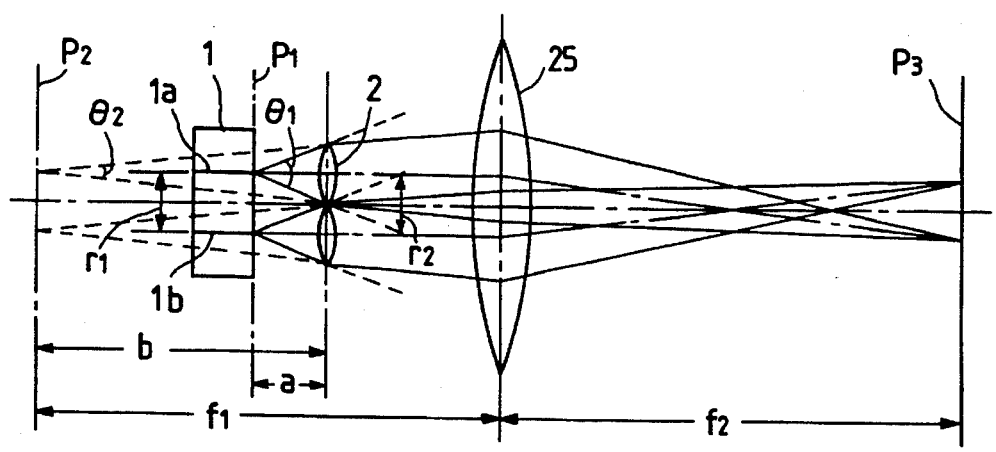
FIG. 7 is an expansion view for showing the conventional optical system, involving the optical axis of the optical system.
Figure 8:
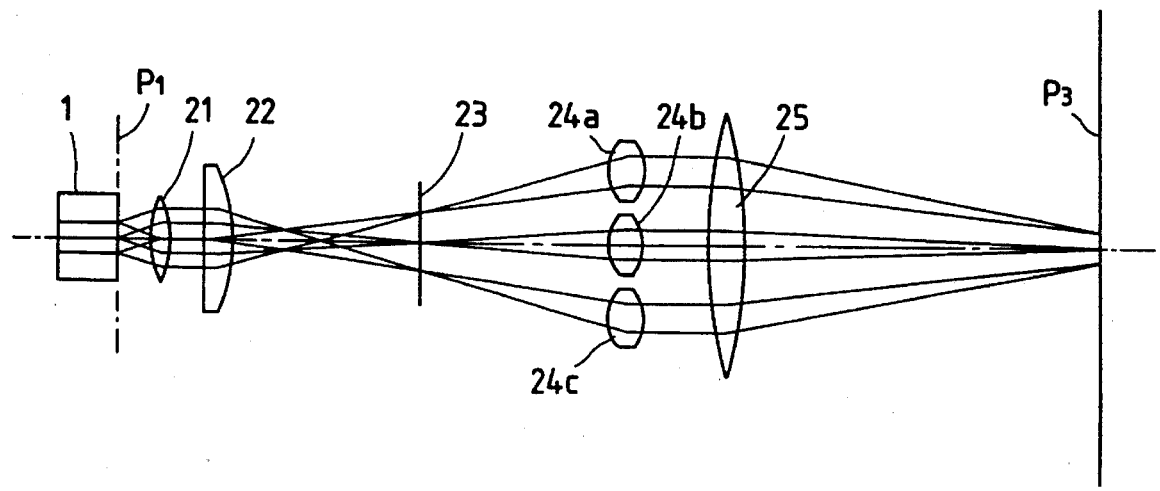
FIG. 8 is an expansion view for indicating another conventional optical system, involving the optical axis of the optical system.

It should be noted that the optical systems according to the third and fourth preferred embodiments may be constructed as $r_1' = r_1$. If such a structure is made, there is no effect that the projection point interval of the laser beams at the second plane P2 are closely spaced. However, there is another merit that the optical system shown in FIG. 7 may be realized by employing the laser array and the micro lens array, the array intervals of which are different from each other. There is a further merit that the laser array may be separated from the micro lens array in a long distance. Usually, a semiconductor laser is mounted on a package having a glass window. A thickness of this glass window per se is several hundred of micrometers, whereas a focal distance of this micro lens is only several hundreds of microns. Accordingly, a specific package must be manufactured from the package of the semiconductor laser in order to construct the optical system of FIG. 7. However, in accordance with these third and fourth preferred embodiments since the relay lens is positioned between the laser array and the micro lens array, the distance between the package of the semiconductor laser array and the micro lens array can be made long, so that the semiconductor laser array mounted on the normal package may be employed.

Figure 5:
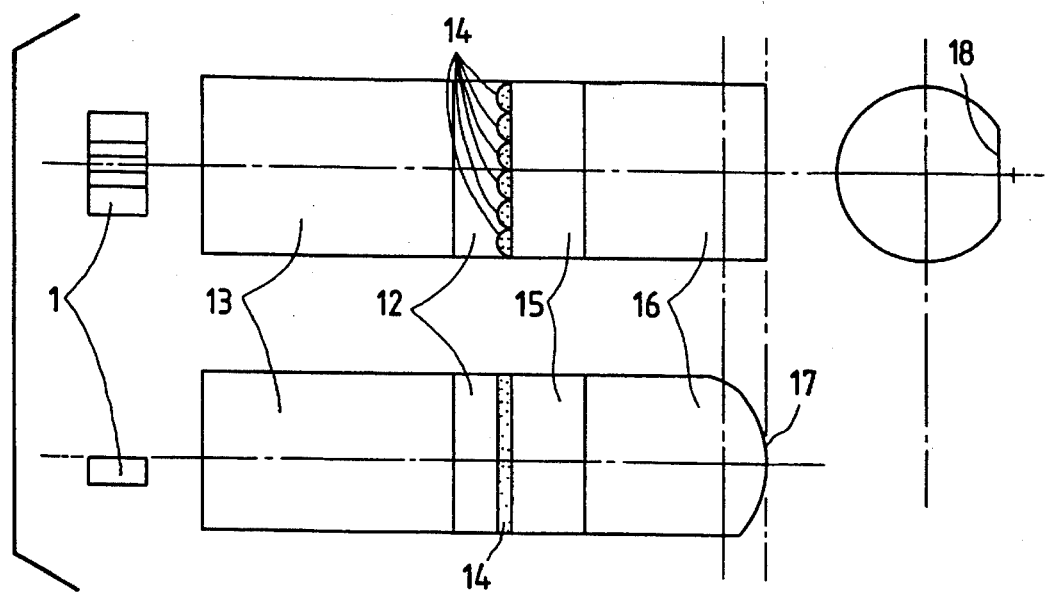
FIG. 5 is a trigonometric expansion view for indicating a fifth preferred embodiment of the present invention.

FIG. 5 is a trigonometric expansion view for showing a fifth preferred embodiment of the present invention. A basic structure of this optical system corresponds to that of FIG. 3. This fifth preferred embodiment has such a feature that the actual optical system is formed by adhering gradient-index type lenses with each other. The relay lens 3 shown in FIG. 3 may be e.g., a rod type gradient-index lens 13 such as a SELFOX lens (registered trademark by Nihon Ita Glass Co., Ltd.). A planar micro lens 12, a rod type spacer 15, and a rod type gradient-index lens 16 whose one edge 17 has been processed to a cylindrical lens are attached to this rod type gradient-index lens 16 functions as a collimator lens. The planar micro lens 12 is formed as an array of the cylindrical lens 14 (lenticular lens) by the ion exchange method. The cylindrical lens 17 of one edge of the rod type gradient-index lens 16 owns magnification in such a direction along which this cylindrical lens 14 does not function as a lens. With this structure, a beam forming is performed. It should be noted that the direction of the planar micro lens 12 may be directed to an opposite direction. That is to say, the cylindrical lens 14 may be directed to the side of the semiconductor laser array 1.

The number of cylindrical lenses 14 is greater than that of laser elements employed in the semiconductor laser array 1, which implies an easy optical alignment adjustment. A plain portion 18 is formed at the side surface of the rod lens. This is to indicate the direction of the cylindrical lens 14.

It should be noted that although all of the rod type gradient-index lens 13, the planar micro lens 12, the rod type spacer 15, and the rod type gradient-index lens 16 are adhered to each other to form the optical system in an integral form in the fifth preferred embodiment shown in FIG. 5, the positional relationship among the optical components may be alternatively fixed by employing a cylindrical spacer in which a space is formed at a portion through which the laser beams pass, instead of the rod type spacer 15, and by fitting a metal cylinder to outer peripheral surfaces of the respective optical components.

Figure 6:
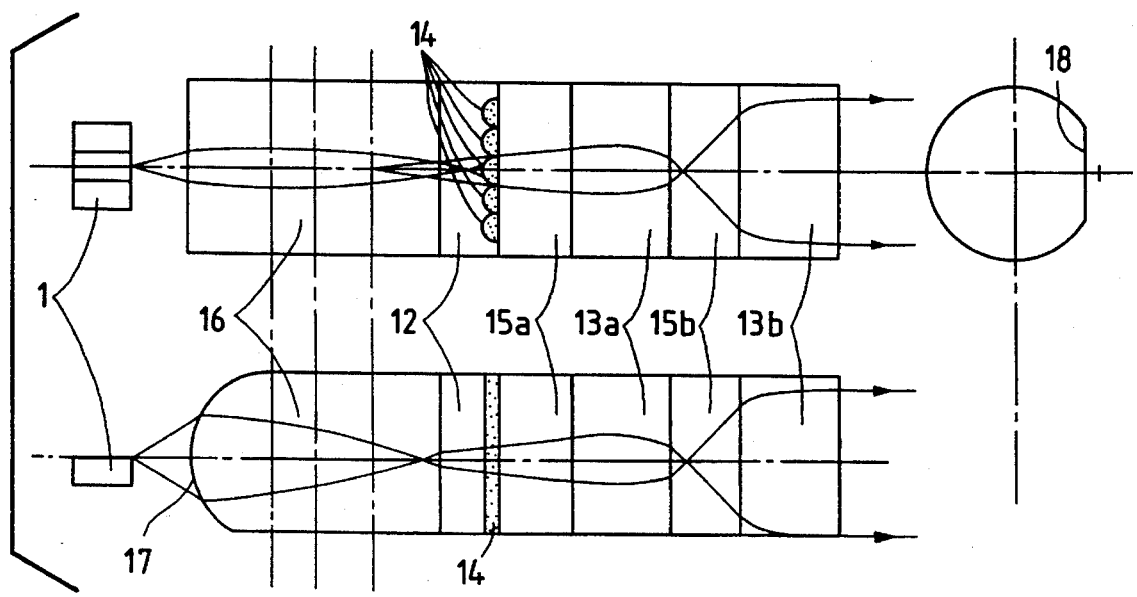
FIG. 6 is a trigonometric expansion view for indication a sixth preferred embodiment of the present invention.

FIG. 6 is a trigonometric expansion view for showing a sixth preferred embodiment of the present invention. In comparison with the structure shown in FIG. 5, a structure of this sixth preferred embodiment is characterized in that a rod type gradient-index lens 16, one edge 17 of which is processed as a cylindrical lens, is arranged at the side of the semiconductor laser array 1, and a beam expander constructed of rod type gradient index lenses 13a and 13b, and rod type spacers 15a and 15b is arranged at a projection side of the planar micro lens 12. Also, a photodiode array (not shown) for detecting a light emission amount at the semiconductor laser array 1 may be arranged at an end portion of the semiconductor laser array 1 located opposite to the side of the rod type gradient-index lens 16.

As previously explained, when the beam expander would be provided in the optical system, the entire optical system would become complex, so that the cost would be increased and the workloads required to adjust the optical system with such a beam expander would be increased, resulting in undesirable results. However, even if such a beam expander must be utilized due to design choice, as shown in FIG. 6, this beam expander may be constructed by adhering the rod type gradient-index lenses to the rod type spacers, so that a total cost and an adjustment workload could be lowered. It should be noted that such a beam expander arrangement may be applied to the above-described prior art systems (see, for example, the above-described Japanese patent application No. 3-227532), resulting in a similar merit.

As easily apparent from the foregoing descriptions, the present invention has such a feature with employment of the simple method for changing the interval of the laser array and the interval of the micro lens array that both of the divergence angle of the laser beam and the projection point interval of the laser beams can be effectively reduced at the same time. Also, there is another feature that the distance between the package of the semiconductor laser array and the micro lens array can be made long. Although the present invention has been described in the application to the multi-beam laser printer, the present invention is not limited thereto, but may be applied to multi-beam type optical disk apparatuses.

Referring drawings, features of the present invention will be described in concrete examples.

Figure 9A:
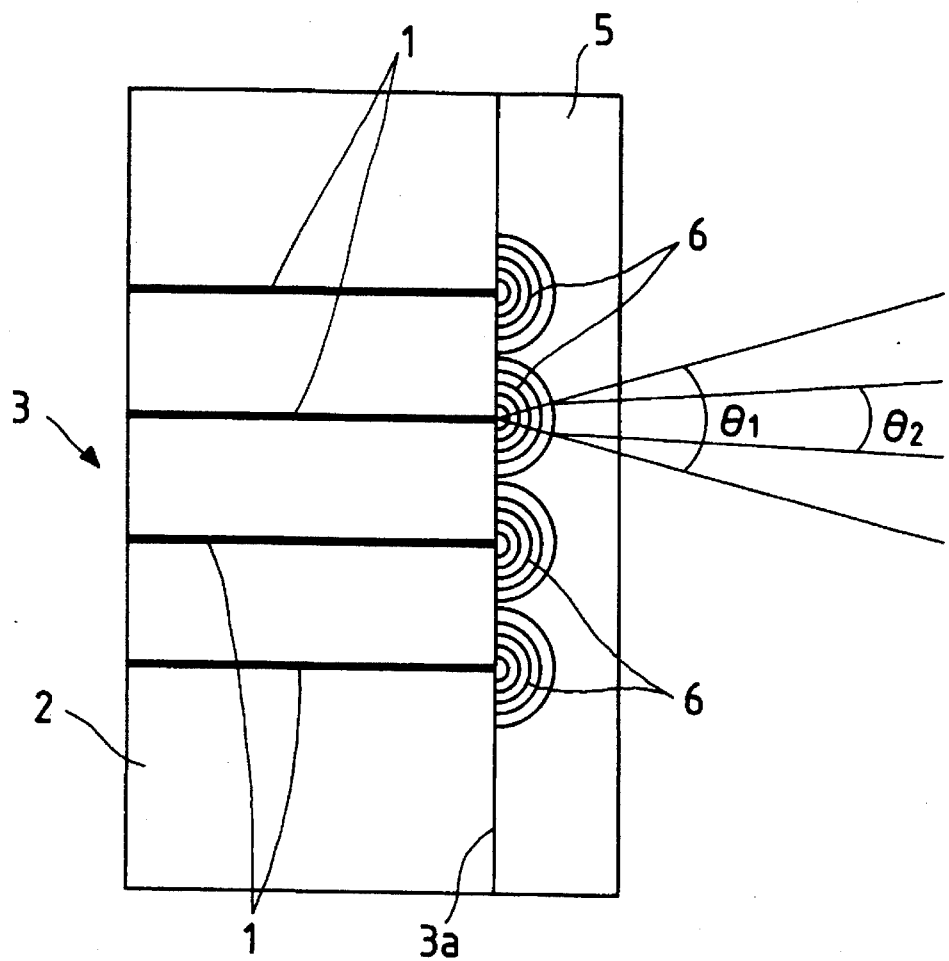
FIG. 9(a) is a plan view and FIG. 9(b) is a sectional view for representing a first preferred embodiment of the present invention.
Figure 9B:
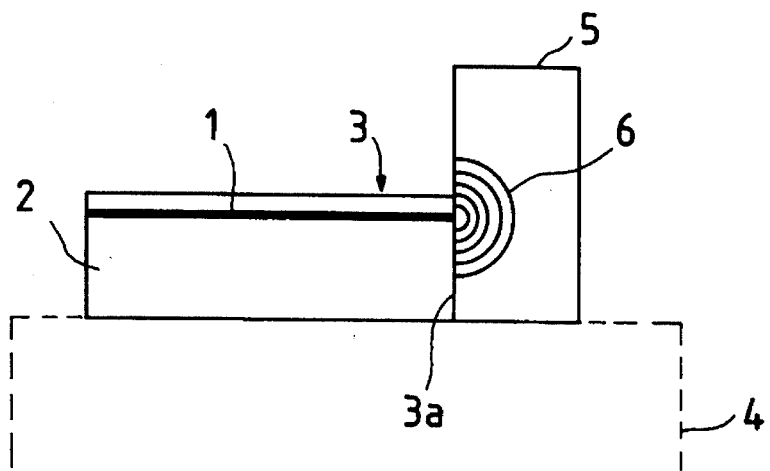
Figure 15:
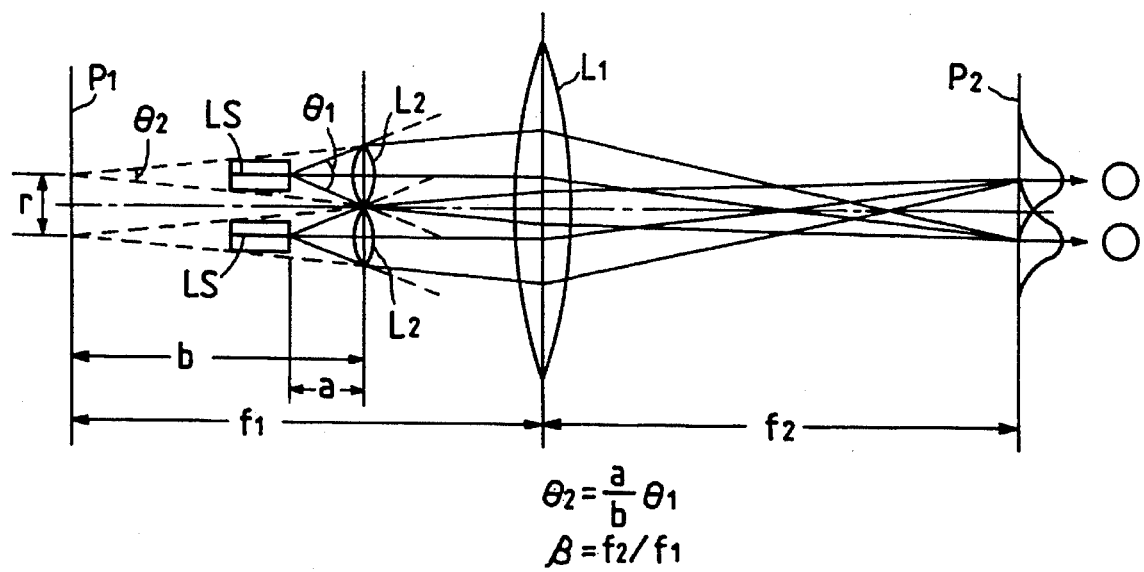
FIG. 15 is an expansion view involving an optical axis of a principle optical system to which the present invention is applied.

In FIGS. 9(a) and 9(b), there are shown, respectively, a plane view and a sectional view of a multi-beam semiconductor laser array according to a first preferred embodiment of the present invention. In the first preferred embodiment, a gradient index type planar micro lens array 5 is closely fitted to a projection edge 3a of laser beams of a semiconductor laser array 3 in which a plurality of separately drivable semiconductor laser elements have been formed on the same substrate 2. In the planar micro lens array 5, gradient index type micro lens 6 are formed at positions corresponding to the respective semiconductor laser elements 1 of the semiconductor layer array 3. In the drawings, half concentric circles indicated at the positions of the micro lens schematically represent distribution conditions of refractive index. Both of the above-described semiconductor laser array 3 and the planar micro lens array 5 are mounted to a heat sink 4 (indicated by a dot line) under mutually close-fitted condition. The laser beams incident upon the planar micro lens array 5 from the semiconductor laser array 3 are bent by the refractive index distributions within the micro lenses 6, so that the divergence angle $\theta_1$ of the laser beams is reduced to $\theta_2$. The structure to reduce this divergence angle of the laser beams corresponds to the optical system shown in FIG. 15.

Figure 10A:
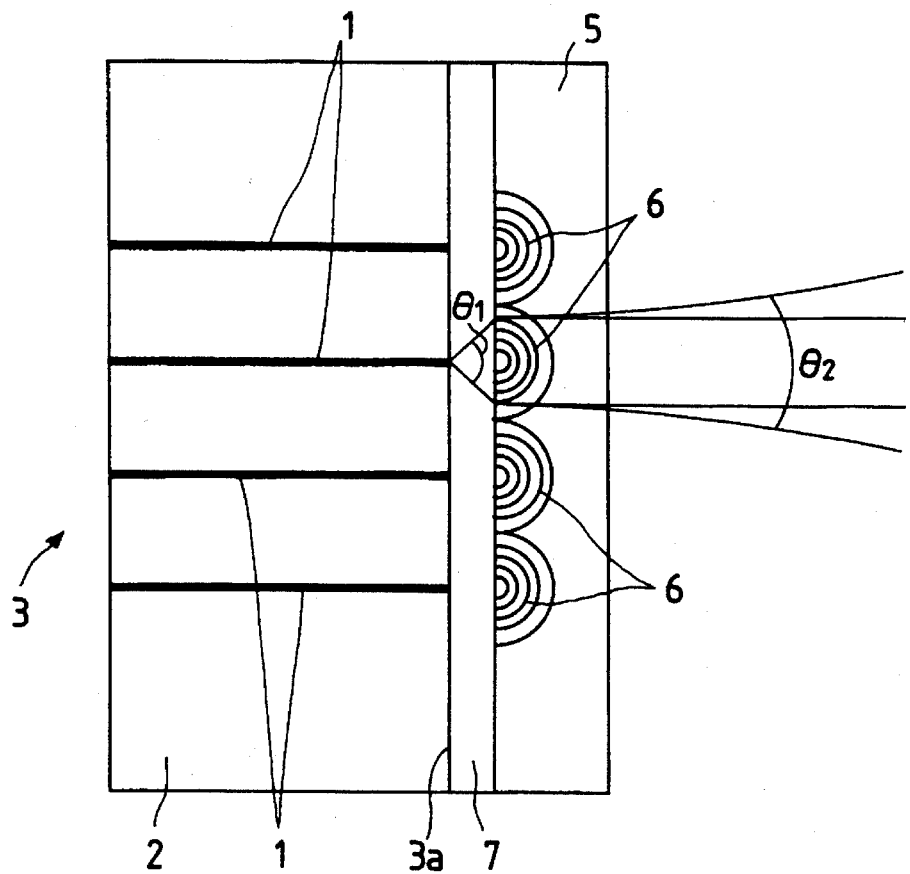
FIG. 10(a) is a plane view and FIG. 10(b) is a sectional view for indicating a second preferred embodiment of the present invention.
Figure 10B:
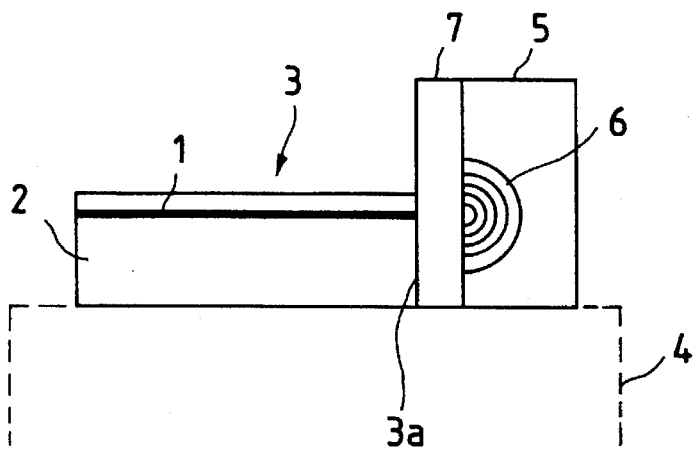

FIGS. 10(a) and 10(b) are, respectively, a plane view and a sectional view of a multi-beam semiconductor laser array according to a second preferred embodiment of the present invention. The multi-beam semiconductor laser array of the second preferred embodiment is so constructed that a transparent spacer 7 such as glass is adhered to the planar micro lens array 5, and thereafter the resultant spacer 7 is abutted against the projection edge 3a of the laser beams of the semiconductor laser array 3.

Figure 16:
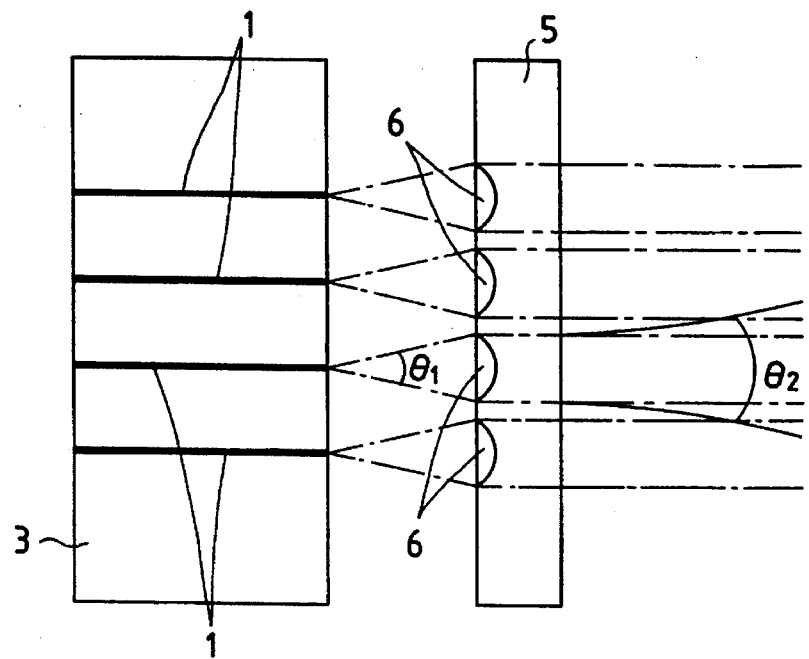
FIG. 16 is an expansion view involving an optical axis of another principle optical system to which the present invention is applied.

When the intervals of the semiconductor laser element 1 and the micro lens 6 are on the other of 10 micrometers, a focal distance of this micro lens 6 is similarly equal to several tens micrometers. In such a case, the transparent spacer 7 may be made on the micro lens array 5 by employing either a method for spin-coating a plastic thin film, e.g., polycarbonate and PMMA, or a method for forming a thin film such as a vapor deposition method and a sputtering method. This second preferred embodiment is similar to the optical system shown in FIG. 16. Alternatively, the optical system of FIG. 15 may be realized by adjusting the thickness of the spacer 7.

The above-explained planar micro lens may be fabricated by diffusing metal ion such as thallium on a glass substrate (see, for instance, "Gradient-Index planar micro-lens prepared from ion exchange technique" written by M. Oikawa, K. Iga and T. Sanada, Japanese Journal of Applied Physics, 20 (4) pages 296–298 in 1981).

Figure 11:
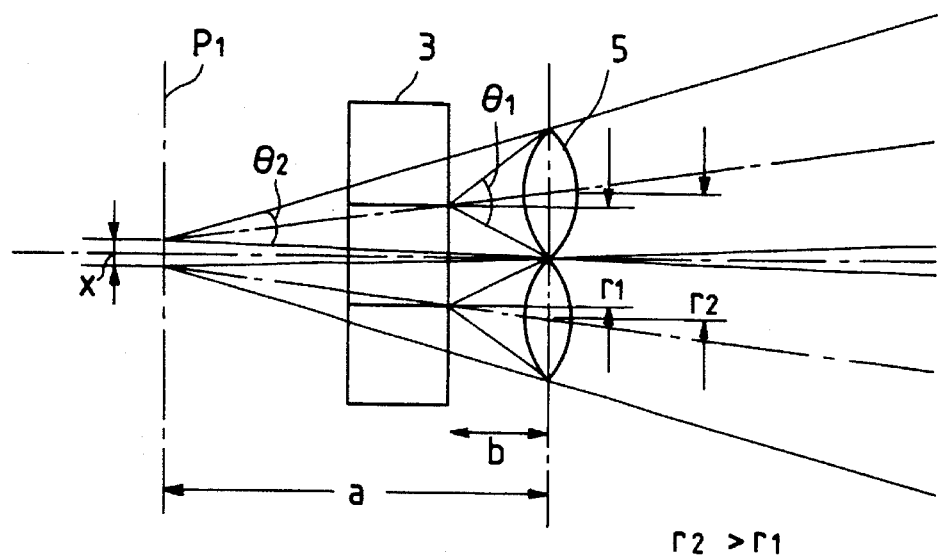
FIG. 11 is an expansion view for showing a modification of the first and second preferred embodiments, involving the optical axis of the optical system.

In the above-described first and second preferred embodiments, both of the semiconductor laser array 3 and the planar micro lens array 5 may be fabricated in such a manner that the array pitches thereof are changed. For instance, as schematically illustrated in FIG. 11, when the array pitch "$r_1$" of the semiconductor laser array 3 would be selected to be smaller than the array pitch "$r_2$" of the planar micro lens array 5, such an effect could be achieved that the interval "x" of the laser projection points at a plane involving the virtual projection points of the laser beams, namely the virtual light source plane P1.

Figure 12:
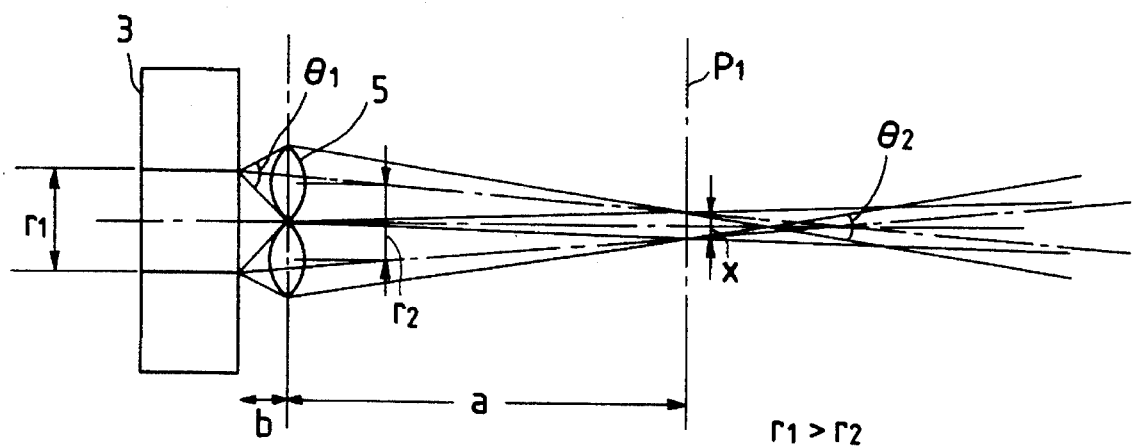
FIG. 12 is an expansion view for representing another modification of the first and second preferred embodiments, involving the optical axis of the optical system.

Also, as shown in FIG. 12, in the second preferred embodiment, the thickness of the transparent spacer 7 may be made greater than the focal distance of the micro lens 6, so that the light source plane P1 would be located opposite to the side of the semiconductor laser array 3 with respect to the planar micro lens array 5. In this case, there is another merit that the divergence angle $\theta_1$ may be similarly reduced to $\theta_2$, and also if the array pitch "$r_1$" of the semiconductor laser array 3 would be made greater than the array pitch "$r_2$" of the planar micro lens array 5, the interval "x" of the laser beam projection points at the light source plane P1 could be made small.

It should be noted that the planar micro lens 6 may be substituted by a cylindrical lens extending along the vertical direction in the respective preferred embodiments. In this case, since the positioning operations of the semiconductor laser array 3 and the planar micro lens array 5 may be roughly performed along the vertical direction, and should be carefully performed along the horizontal direction, the optical alignment adjustment for these optical components could be readily performed.

Further, the number of planar micro lens 6 may be selected to be larger than that of the semiconductor laser element 1. In this case, since any one of large quantities of micro lenses 6 merely corresponds to any one of the semiconductor laser elements 1, the optical alignment adjustment along the horizontal direction may be easily performed.

Figure 13:
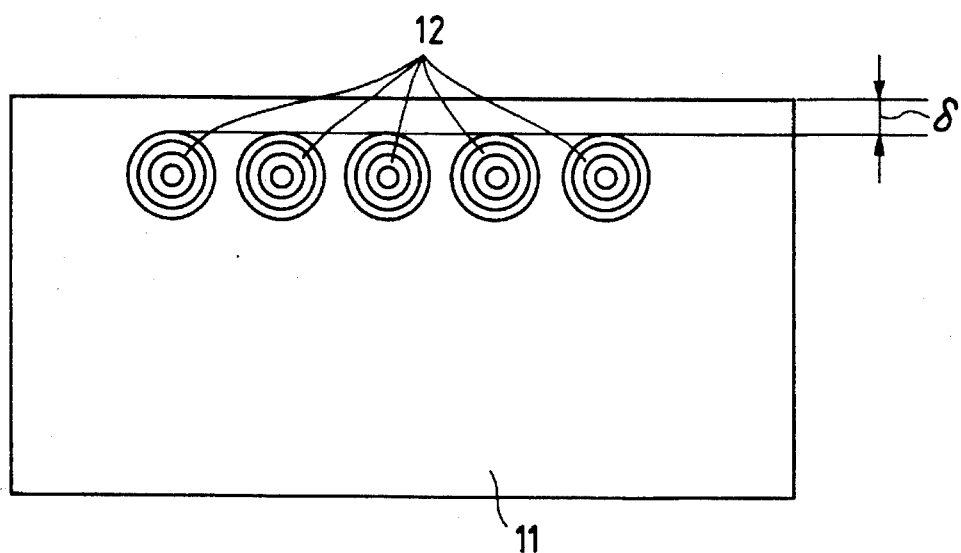
FIG. 13 is a sectional view of the embedded type planar micro lens.

It is known in the art that when a so-called "two-stage ion diffusion method" is utilized to fabricate the planar micro lens, the portion having the refractive index distribution may be embedded into the glass substrate. This is such an ion diffusion method that after thallium ion functioning as ion to increase the refractive index has been diffused, another ion, for example, ion originally and mainly contained in the glass substrate is diffused, while applying a potential thereto. As shown in FIG. 13, such a structure may be obtained in accordance with this ion diffusing method that a micro lens 12 is embedded into a glass substrate 11 by a depth of "$\delta$". When the planar micro lens array 5 is formed by way of the two-stage ion diffusion method, this micro lens array per se may be embedded into the glass substrate, so that the spacer 7 can be omitted. It should be noted that when the planar micro lenses are manufactured by way of the two-stage ion diffusion method, the method for manufacturing such an optical waveguide may be applied, as opened in, for instance, "Planar gradient-index glass waveguide and its applications to a 4-port branched circuit and star coupler" written by E. Okuda, I. Tanaka, and T. Yamasaki, Appln. Opt. 23, pages 1745 in 1984.

Also, in the above-described first and second preferred embodiments, reflectivity may be controlled by coating the edge 3a of the semiconductor laser array 3 at the side of the planar micro lens array 5. If the refractive index "n2" of the edge coating film can satisfy $(n2)^2=(n1 \times n3)^2$ with regard to the refractive index n1 of the material for the semiconductor laser and the index n3 of the material for the planar micro lens array 5, the reflectivity may be controlled by properly changing the film thickness of the edge coating film. For example, if the edge coating film having the thickness of a ¼ wavelength would be coated to the edge 3a of the semiconductor laser array 3, then the resultant reflectivity would become low. To the contrary, if the edge coating film having the thickness of a ½ wavelength would be coated to the edge 3a of the semiconductor laser array 3, the resultant reflectivity would become high. As previously explained, since the threshold value and the maximum power of the laser can be set by controlling the reflectivity, a design choice can be highly increased.

If the material of the semiconductor laser array 3 is AlGaAs (refractive index n1=3.5) and the material of the planar micro lens array 5 is glass (refractive index n3=1.5), the refractive index of the edge coating material n2=2.3. There are $TiO_2$, $Ta_2O_5$, $ZrO_2$, $CeO_2$, ZnSe and the like as such the edge coating material of such a refractive index. As the refractive indexes of these materials are varied within a certain range by way of the film deposition method (vapor deposition method and sputtering method) and the film deposition condition (film deposition speed and substrate temperature), such an edge coating film which can satisfy the above-described relationship of $(n2)^2=(n1 \times n3)_2$ can be obtained. It should be noted that this change in the refractive index is caused by variations in the chemical composition ratio and the physical condition (polycrystal state, or amorphous state) of the deposited film due to the film deposition method and the film deposition condition.

Figure 14:
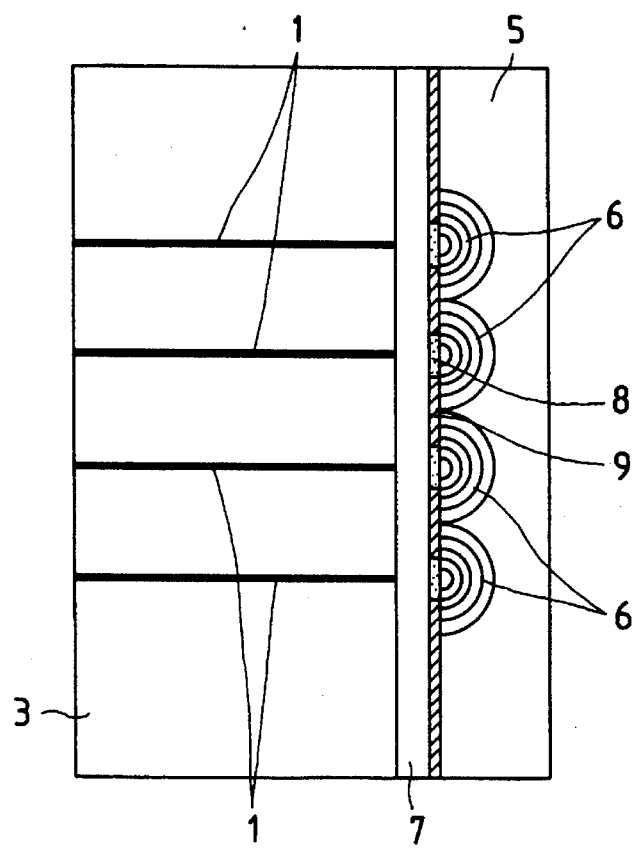
FIG. 14 is a plan view for indicating a third preferred embodiment of the present invention.

FIG. 14 is a plan view of a multi-beam semiconductor laser array according to a third preferred embodiment of the present invention. This third preferred embodiment corresponds to the above-explained second preferred embodiment in which a phase shifter 8 is provided between the spacer 7 and the micro lens array 5. The phase shifter 8 is fabricated by vapor-depositing a dielectric thin film on either the micro lens array 5, or the spacer 7 and thereafter by the photo-lithography. Subsequently, the micro lens array 5 is adhered to the spacer 7 by an optical adhesive agent 9. A phase difference is produced by a difference between the refractive index of the optical adhesive agent and the refractive index of the dielectric thin film.

The laser beams emitted from the respective semiconductor laser elements 1 of the semiconductor laser array 3 pass through the spacer 7 and the micro lens array 5. A phase difference is produced between the central laser beam light passing through the portion of the dielectric thin film, and the peripheral laser beam light passing through the portions other than this dielectric thin film, and then a diameter of laser beam spot formed when the laser beams are focused onto the focusing plane having the optical conjugate relationship with the plane where the phase shifter 8 is located, becomes small. As a consequence, a so called "phase shift type light source for a super resolution optical system" can be obtained. In this case, an easy alignment adjustment can be similarly achieved.

According to the present invention, even when the laser array having the wide array intervals is used, the intervals of the image forming spots at the focal point plane can be closely spaced by the simple optical system without utilizing the interlaced scanning operation. Also, the distance between the package of the semiconductor laser array and the micro lens array can be made long, so that easy mounting of the optical system according to the present invention can be realized.

Further, in accordance with the multi-beam semiconductor laser array of the present invention, since the micro lens array is closely fitted to the laser beam projection edge of the multi-beam semiconductor laser array, when the spot intervals on the image forming plane are essentially, closely spaced with each other by employing the multi-beam semiconductor laser array and the micro lens array, the array intervals of which are made wide, the optical alignment adjustment can be readily performed.

What is claimed is:

1. A multi-beam laser light source, comprising:

a laser array having a plurality of independently drivable laser elements arranged with an equal projection point interval therebetween; and a lens array having a plurality of lenses receiving light from the laser elements, the plurality of lenses being arranged with an interval therebetween shorter than the projection point interval;

wherein the lenses focus light from the laser elements on a surface, and an interval between adjacent focused light spots on the surface is shorter than the projection point interval, and wherein $x=r_2-(r_1-r_2)\alpha$, $r_1>r_2x$) is satisfied, wherein
   $r_1$ is the interval of the projecting points,
   $r_2$ is the interval of the lens array.
   x is the interval between the focused light spots on the surface, and
   $\alpha$ is a projection magnifying power of said lenses.

2. A multi-beam laser light source of claim 1, wherein $\alpha=b/a$, wherein a is a distance between said laser array and said lens array, and b is a distance between said lens array and said surface.

3. A multi-beam laser source of claim 1, wherein the number of lenses in the lens array at least equals the number of laser elements, and each of the laser elements is optically connected to one of the lenses.

4. A multi-beam laser light source of claim 1 wherein the number of lenses in the lens array equals the number of laser elements, and each of the laser elements is optically connected to one of the lenses.

5. A multi-beam laser source of claim 1, wherein the laser elements and the lenses are arranged in one dimension.

6. A multi-beam laser light source, comprising:
- a laser array having a plurality of independently drivable laser elements arranged with an equal projection point interval therebetween; and
- a lens array having a plurality of lenses receiving light from the laser elements, the plurality of lenses being arranged with an interval therebetween longer than the projection point interval;
- wherein the lenses focus virtual projection points of light from the laser elements on a surface on the opposite side of the laser than the lens array, and an interval between adjacent virtual projection points of the light on the surface being shorter than the projection point interval, and
- wherein $x=r_1-(r_2-r_1)\alpha(r_2>r_1>x)$ is satisfied, wherein
  - $r_1$ is the interval of the projection points,
  - $r_2$ is the interval of the lens array,
  - x is a distance between the virtual projection points on the surface, and
  - $\alpha$ is a projection magnifying power of said lenses.

7. A multi-beam laser light source of claim 6, wherein $\alpha=b/a$, wherein
- a is a distance between the laser array and the lens array, and
- b is a distance between the lens array and the surface.

8. A multi-beam laser light source of claim 6, wherein the number of lenses in the lens array at least equals the number of laser elements, and each of the laser elements is optically connected to one of the lenses.

9. A multi-beam laser light source of claim 6, wherein the number of lenses in the lens array equals the number of laser elements, and each of the laser elements is optically connected to one of the lenses.

10. A multi-beam laser light source of claim 6, wherein the laser elements and the lenses are arranged in one dimension.

11. A multi-beam laser light source, comprising;
- a laser array having a plurality of independently drivable laser elements arranged with an equal projection point interval therebetween;
- a lens array having a plurality of lenses arranged at an equal interval;
- a relay lens between the laser array and the lens array; and
- an intermediate plane projected by the relay lens between the lens array and the relay lens;
- wherein the lenses focus light from the laser elements on a surface on the opposite side of the lens array than the laser elements through said intermediate plane, and the interval between adjacent focused light spots on the surface is shorter than the projection point interval, and
- wherein $x=r_2-(\beta\times r_1-r_2)\alpha$ is satisfied, wherein
  - $r_1$ is the interval of the projection points,
  - $r_2$ is the interval of the lens array,
  - x is a distance between the focused light spots on the surface,
  - $\alpha$ is a projection magnifying power of the lenses, and
  - $\beta$ is a projection magnifying power of the relay lens.

12. A multi-beam laser light source of claim 11, wherein $\alpha=b/a$ and $\beta=d/c$ are satisfied, wherein
- a is a distance between the laser array and the intermediate plane,
- b is a distance between the lens array and the surface,
- c is a distance between the laser array and the relay lens, and
- d is a distance between the relay lens and the intermediate plane.

13. A multi-beam laser light source of claim 11 wherein the number of lenses in the lens array at least equals the number of laser elements, and each of the laser elements is optically connected to one of the lenses.

14. A multi-beam laser light source of claim 11, wherein the number of lenses in the lens array equals the number of laser elements, and each of the laser elements is optically connected to one of the lenses.

15. A multi-beam laser light source of claim 11 wherein the laser elements and the lenses are arranged in one dimension.

16. A multi-beam laser light source, comprising:
- a laser array having a plurality of independently drivable laser elements arranged with an equal projection point interval therebetween;
- a lens array including a plurality of lenses arranged with an equal interval;
- a relay lens arranged between the laser array and the lens array; and
- an intermediate plane projected by the relay lens between the lens array and the relay lens;
- wherein the lenses focus virtual projection points of light from the laser elements on a surface on the opposite side of the laser elements than the lens array through said intermediate plane, and an interval between adjacent virtual projection point lights on the surface being shorter than the projection point interval, and
- wherein $x=\beta\times r_1-r_2-\alpha\times(r_2-\beta\times r_1)$ is satisfied, wherein
  - $r_1$ is the interval of the projection points,
  - $r_2$ is the interval of the lens array,
  - x is a distance between the virtual projection points of lights on the surface,
  - $\alpha$ is a projection magnifying power of said lenses, and
  - $\beta$ is a projection magnifying power of said relay lens.

17. A multi-beam laser light source of claim 16, wherein $\alpha=b/a$ and $\beta=d/c$ are satisfied, wherein
- a is a distance between the laser array and the intermediate plane,
- b is a distance between the lens array and the surface,
- c is a distance between the laser array and the relay lens, and
- d is a distance between the relay lens and the intermediate plane.

18. A multi-beam laser light source of claim 16, wherein the number of lenses in the lens array equals at least the number of laser elements, and each of the laser elements is optically connected to one of the lenses.

19. A multi-beam laser light source of claim 16, wherein the number of lenses in the lens array equals the number of laser elements, and each of the laser elements is optically connected to one of the lenses.

20. A multi-beam laser light source of claim 16, wherein the laser elements and the lenses are arranged in one dimension.

21. A multi-beam laser light source, comprising:
- a laser array wherein a plurality of independently drivable laser elements are arranged so that each of a plurality of projection points are spaced apart by an equal interval; and a lens array wherein a plurality of lenses into which a projected light is directly injected are arranged in an equal interval different from said interval of said projection points, wherein imaginary projection points which are arranged to be spaced at an interval smaller than the equal interval of said projection points in an array direction of said laser array and said lens array, and wherein a relationship of $x=r2-(r1-r2)\hat{\ }a$, $(r1>r2>x, \hat{\ }a=b/a)$ is satisfied, wherein r1 is the interval of said projection points,
r2 is the interval of said lens array,
x is the interval of said imaginary projection points,
a is a distance between said laser array and said lens array, and
b is a distance between said lens array and said imaginary projection points.

22. A multi-beam laser light source, comprising:

a laser array wherein a plurality of independently drivable laser elements are arranged so that each of a plurality of projection points are spaced apart by an equal interval; and a lens array wherein a plurality of lenses into which a projected light is directly injected are arranged in an equal interval different from said interval of said projection points, wherein imaginary projection points which are arranged to be spaced at an interval smaller than the equal interval of said projection points in an array direction of said laser array and said lens array, and wherein a relationship of $x=r2-(r1-r2)\alpha$, $(r1>r2>x, \alpha=b/a)$ is satisfied, wherein r1 is the interval of said projection points,
r2 is the interval of said lens array,
x is the interval of said imaginary projection points,
a is a distance between said laser array and said lens array, and
b is a distance between said lens array and said imaginary projection points.

23. A multi-beam laser light source, comprising:

a laser array wherein a plurality of independently drivable laser elements are arranged so that each of a plurality of projection points are spaced apart by an equal interval lens;

a lens array wherein a plurality of lenses into which a projected light is directly injected are arranged in an equal interval different from said interval of said projection points; and a relay lens between said laser array and a micro lens;

wherein an intermediate plane is formed between said micro lens and said relay lens where said projection points are projected by said relay lens;

wherein imaginary projection points which are arranged to be spaced at an interval smaller than the equal interval of said projection points in an array direction of said laser array and said lens array; and wherein a relationship of $x=r2-(\beta r1-r2)/\alpha$, $(\alpha=b/a, \beta=d/c)$ is satisfied, wherein r1 is an interval of said projection points,
r2 is an interval of said lens array,
x is an interval of said imaginary projection points,
a is a distance between said lens array and said intermediate plane,
b is a distance between said lens array and said imaginary projection point,
c is a distance between said laser array and said relay lens, and
d is a distance between said relay lens and said intermediate plane.

24. A multi-beam laser light source, comprising:

a laser array wherein a plurality of independently drivable laser elements are arranged so that each of a plurality of projection points are spaced apart by an equal interval;

a lens array wherein a plurality of lenses into which a projected light is directly injected are arranged in an equal interval different from said interval of said projection points; and a relay lens between said laser array and a micro lens;

wherein an intermediate plane is formed between said micro lens and said relay lens where said projection points are projected by said relay lens;

wherein imaginary projection points which are arranged to be spaced at an interval smaller than the equal interval of said projection points in an array direction of said laser array and said lens array, and wherein a relationship of $x=\beta r1-(r2-\beta r1)\alpha$, $(\alpha=b/a, \beta=d/c)$ is satisfied, wherein r1 is an interval of said projection points,
r2 is an interval of said lens array,
x is an interval of said imaginary projection points,
a is a distance between said lens array and said intermediate plane,
b is a distance between said lens array and said imaginary projection point,
c is a distance between said laser array and said relay lens, and
d is a distance between said relay lens and said intermediate plane.

* * * * *

UNITED STATES PATENT AND TRADEMARK OFFICE
CERTIFICATE OF CORRECTION

PATENT NO. : 5,465,265
DATED : November 07, 1995
INVENTOR(S) : Takeshi OTA

It is certified that error appears in the above-indentified patent and that said Letters Patent is hereby corrected as shown below:

Claim 1, Column 14, Line 54, "$x=r_2-(r_1-r_2)\alpha, r_1>r_2 x)$" should read --$x = r_2-(r_1-r_2)\alpha \quad r_1>r_2>x)$--.

Claim 6, Column 15, line 22, "$x=r_1-(r_2-r_1)\alpha(r_2>r_1>x)$" should read --$x = r_1-(r_2-r_1)\alpha \quad (r_2>r_1>x)$--.

Claim 21, Column 17, Lines 12 and 13, "x=r2-(r1-r2)^a, (r1>r2>x, ^a=b/a)" should read --$x = r_2-(r_1-r_2)\alpha, (r_1>r_2>x, \alpha=b/a)$--.

Claim 21, Column 17, Line 14, "r1" should read --$r_1$--.

Claim 21, Column 17, Line 15, "r2" should read --$r_2$--.

Claim 22, Column 17, Lines 34 and 35, "x=r2-(r1-r2)$\alpha$, (r1>r2>x, $\alpha$=b/a)" should read --$x = r_2-(r_1-r_2)\alpha, (r_1>r_2>x, \alpha=b/a)$--.

Claim 22, Column 17, Line 36, "r1" should read --$r_1$--.

Claim 22, Column 17, Line 37, "r2" should read --$r_2$--.

UNITED STATES PATENT AND TRADEMARK OFFICE
CERTIFICATE OF CORRECTION

PATENT NO. : 5,465,265
DATED : November 07, 1995
INVENTOR(S) : Takeshi OTA

It is certified that error appears in the above-indentified patent and that said Letters Patent is hereby corrected as shown below:

Claim 23, Column 18, Lines 8 and 9 "x=r2-($\beta$r1-r2)/$\alpha$, ($\alpha$=b/a, $\beta$=d/c)" should read --$x = r_2 - (\beta r_1 - r_2)/\alpha$, ($\alpha$=b/a, $\beta$=d/c)--.

Claim 23, Column 18, Line 10, "r1" should read --$r_1$--.

Claim 23, Column 18, Line 11, "r2" should read --$r_2$--.

Claim 24, Column 18, Line 38 "x=$\beta$r1-(r2-$\beta$r1)$\alpha$, ($\alpha$=b/a, $\beta$=d/c)" should read --$x = \beta r_1 - (r_2 - \beta r_1)\alpha$, ($\alpha$=b/a, $\beta$=d/c)--.

Claim 24, Column 18, Line 40, "r1" should read --$r_1$--.

Claim 24, Column 18, Line 41, "r2" should read --$r_2$--.

Signed and Sealed this

Twenty-ninth Day of October 1996

Attest:

BRUCE LEHMAN

*Attesting Officer*  *Commissioner of Patents and Trademarks*